(12) United States Patent
Horijon

(10) Patent No.: US 8,528,193 B2
(45) Date of Patent: Sep. 10, 2013

(54) COMPONENT PLACEMENT UNIT FOR PLACING A COMPONENT ON A SUBSTRATE

(75) Inventor: Joseph Louis Horijon, Eindhoven (NL)

(73) Assignee: Assembleon B.V. (NL)

( * ) Notice: Subject to any disclaimer, the term of this patent is extended or adjusted under 35 U.S.C. 154(b) by 650 days.

(21) Appl. No.: 12/698,755

(22) Filed: Feb. 2, 2010

(65) Prior Publication Data
US 2010/0209227 A1    Aug. 19, 2010
US 2013/0142609 A9    Jun. 6, 2013

Related U.S. Application Data

(63) Continuation of application No. 11/693,442, filed on Mar. 29, 2007, now Pat. No. 7,941,913.

(30) Foreign Application Priority Data

Mar. 30, 2006  (NL) ..................................... 1031471
Dec. 5, 2006   (NL) ..................................... 1033000
Feb. 3, 2009   (NL) ..................................... 1036507

(51) Int. Cl.
*B23P 19/00* (2006.01)

(52) U.S. Cl.
USPC ................................ 29/739; 29/740; 29/834

(58) Field of Classification Search
USPC ........... 29/739–743, 705, 721; 356/399–401; 250/203.4, 216, 236
See application file for complete search history.

(56) References Cited

U.S. PATENT DOCUMENTS

| 4,608,494 | A | * | 8/1986 | Kobayashi et al. | 250/461.1 |
| 5,559,727 | A | * | 9/1996 | Deley et al. | 700/279 |
| 5,701,661 | A | * | 12/1997 | van den Brink | 29/721 |
| 5,880,849 | A | * | 3/1999 | Van De Ven | 356/399 |
| 5,897,611 | A |   | 4/1999 | Case et al. | |
| 7,570,801 | B2 | * | 8/2009 | Horijon | 382/151 |
| 7,941,913 | B2 | * | 5/2011 | Horijon | 29/739 |
| 2007/0229851 | A1 | * | 10/2007 | Horijon | 356/615 |

FOREIGN PATENT DOCUMENTS

EP    1840503    3/2007

OTHER PUBLICATIONS

International Search Report and Written Opinion dated Sep. 22, 2009, for Netherlands Application 1036507.

* cited by examiner

*Primary Examiner* — Minh Trinh
(74) *Attorney, Agent, or Firm* — Barnes & Thornburg LLP

(57) ABSTRACT

A device suitable for producing an image of an object disposed in an object space by means of a sensor comprises at least the sensor, a first lens assembly disposed in front of the sensor, a stop plate comprising a light passage disposed in front of the first lens assembly, a second lens assembly disposed in front of the stop plate and the object space disposed in front of the second lens assembly. The device further comprises a light source, as well as a diffuser which is disposed on a side of the object space that is averted from the light source.

9 Claims, 9 Drawing Sheets

COMPONENT PLACEMENT UNIT FOR PLACING A COMPONENT ON A SUBSTRATE

CROSS-REFERENCE TO RELATED APPLICATIONS

Figure 1:
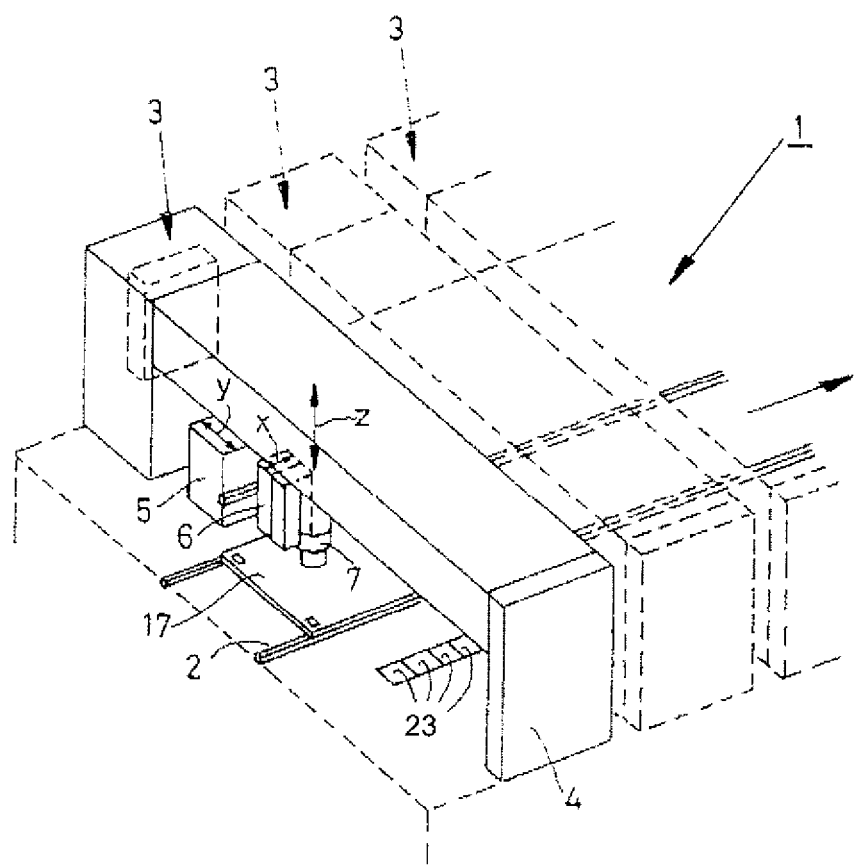

This application is a continuation-in-part of U.S. application Ser. No. 11/693,442, filed Mar. 29, 2007, and now U.S. Pat. No. 7,941,913 and which claims priority under 35 U.S.C. §119 to Netherlands Application No. NL 1031471, filed Mar. 30, 2006 and to Netherlands Application No. NL 1033000, filed Dec. 5, 2006.

The invention relates to a device suitable for producing an image of an object disposed in an object space by means of a sensor, which device at least comprises the sensor, a first lens assembly disposed in front of the sensor, a stop plate comprising a light passage disposed in front of the first lens assembly, a second lens assembly disposed in front of the stop plate and the object space disposed in front of the second lens assembly.

The invention also relates to a component placement unit for placing a component on a substrate, which component placement unit comprises at least a nozzle which is rotatable about a central axis, by means of which a component can be picked up and placed on the substrate, which component placement unit further comprises at least a device for producing an image of the component disposed in an object space, which device comprises at least the sensor, a first lens assembly disposed in front of the sensor, a stop plate comprising a light passage, disposed in front of the first lens assembly, a second lens assembly disposed in front of the stop plate and the object space disposed in front of the second lens assembly.

With such a component placement unit known from European Patent EP-A1-1.840.503 of applicant, a number of images is produced of a component picked up by a nozzle, during rotation of the component about a central axis by means of a device.

In the known device a light source is disposed on one side of the object space that is averted from the second lens assembly. By means of the light source, the component is illuminated from the side that is averted from the second lens assembly. Light beams are prevented by the component from reaching the sensor via the second lens assembly, the stop plate and the first lens assembly. Other light beams produced by the light source do reach the sensor via the second lens assembly, the passage in the stop plate and the first lens assembly. By means of the sensor an image of the component can thus be produced, according to which the position of the component with respect to the nozzle can be determined. Next the component is placed on a substrate with a desired orientation.

Since the light source is being disposed on a side of the second lens assembly that is averted from the object space, the light source should be provided with a separate electronic driving and cabling. Moreover such light source occupies relatively much space and is relatively heavy.

The invention aims at providing a device with which a good illumination of an object in an object space can be obtained in a relatively simply manner.

This object is achieved with the device according to the invention in that the device further comprises a light source, as well as a diffuser which is disposed on a side of the object space that is averted from the light source.

The light source can simply be integrated in the unit comprising the sensor, the lens assemblies and the stop plate, both mechanically and electronically. In this manner, there is no need for a separate control unit for the light source. By means of the diffuser the light from the light source is diffused, during which a part of the light that is reflected by the diffuser illuminates the component and reaches the sensor by way of the second lens assembly, the passage in the stop plate and the first lens assembly, thus obtaining an image of the object like a component.

If instead of a diffuser a perfect mirror or a perfect retro-reflector would be used, then the light from the reflecting stop plate will not be reflected by the diffuser towards the passage in the stop plate.

One embodiment of the device according to the invention is characterized in that the light source is disposed between the stop plate and the second lens assembly, as well as is directed towards a reflecting side of the stop plate.

By means of the stop plate the light from the light source is reflected and diffused in the direction of the second lens assembly, to subsequently illuminate the object via the diffuser from a side that is averted from the light source. By positioning the light source between the stop plate and the second lens assembly, a more effective illumination is obtained than in case of the light source being disposed on a side of the second lens assembly that is averted from the stop plate.

Another embodiment of the device according to the invention is characterized in that the diffuser has a half-value width angle that is nearly similar to twice the angle of incidence of a light beam from the light source, reflected by the stop plate.

The half-value width angle, also called full width at half maximum (FWHM) angle, is the angle between those light beams that have an intensity which is half that of the maximum intensity. With such angle the most effective light output is obtained.

The invention also relates to a component placement unit that is characterized in that the device further comprises a light source, as well as a diffuser which is disposed on a side of the object space that is averted from the light source.

By means of such component placement unit the position of a component relative to the nozzle can be determined in a relatively simple way. Because there is no need for a separate illumination unit with the associated electronics, the weight of the component placement unit is relatively low, which improves the accuracy with which the component can be placed on the substrate.

Another embodiment of the component placement unit according to the invention is characterized in that the optical axis of the lens assemblies extends parallel to the central axis of the nozzle, while a deflection element being disposed between the lens assemblies and the central axis, by means of which at least a contour of the component in the object space can be imaged on the sensor.

In this manner a compact construction of the component placement unit is achieved.

Yet another embodiment of the component placement unit according to the invention is characterized in that an image of at least part of the substrate can be produced by means of the sensor as well.

In this manner simple deviations can be determined between the desired position and the real position of the component relative to the nozzle, and of the desired orientation and the real orientation of the substrate relative to the nozzle, using only one device for producing the necessary images.

Figure 2:
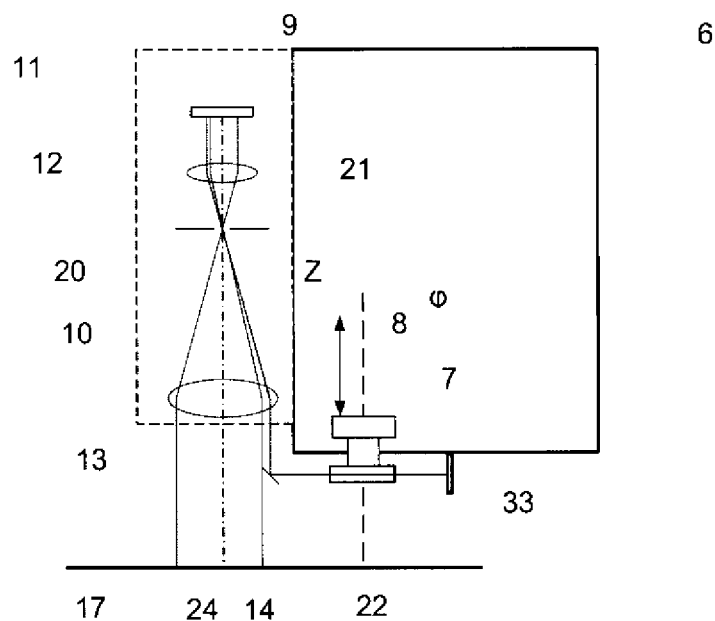
Figure 3:
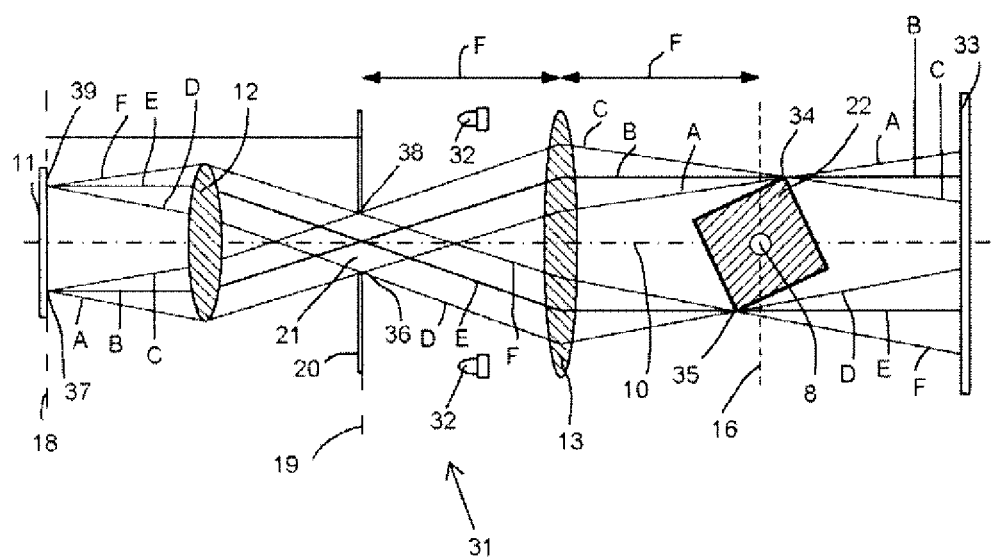
Figure 4:
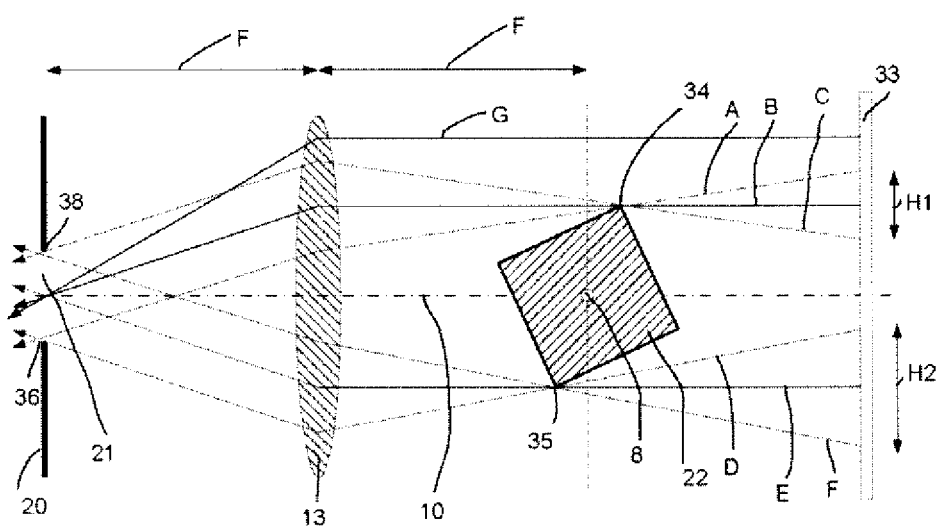
Figure 5:
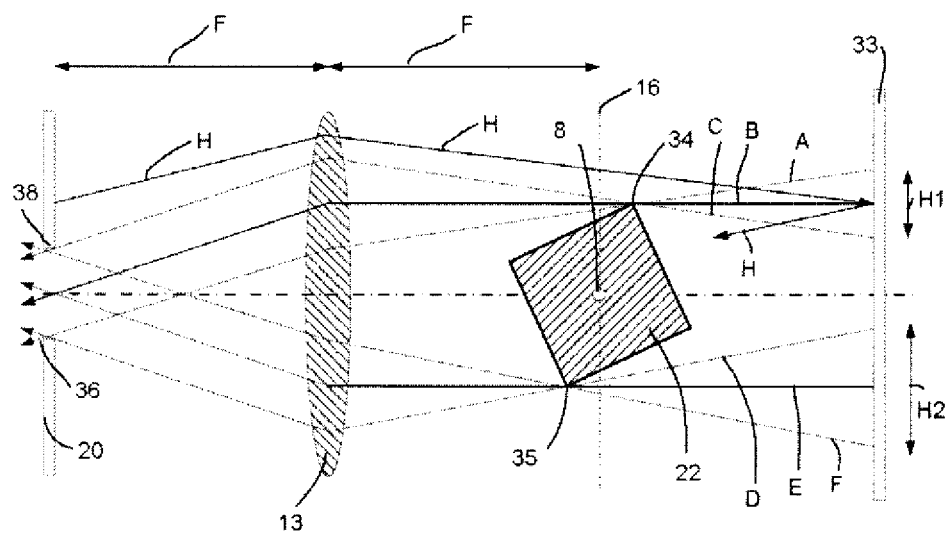
Figure 6:
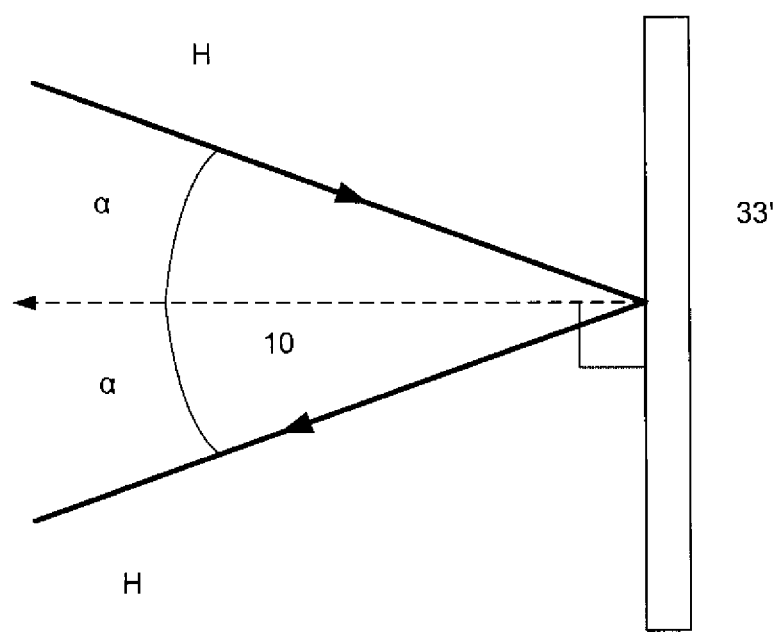
Figure 7:
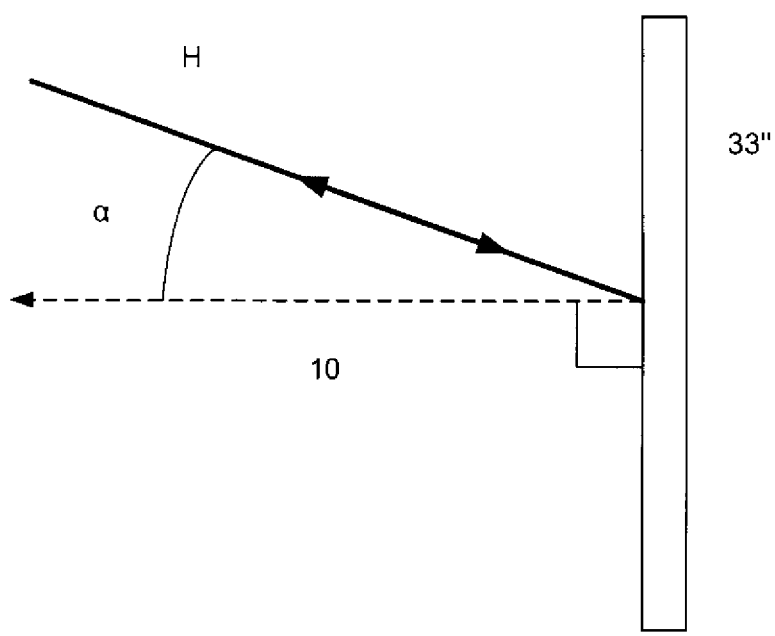
Figure 8:
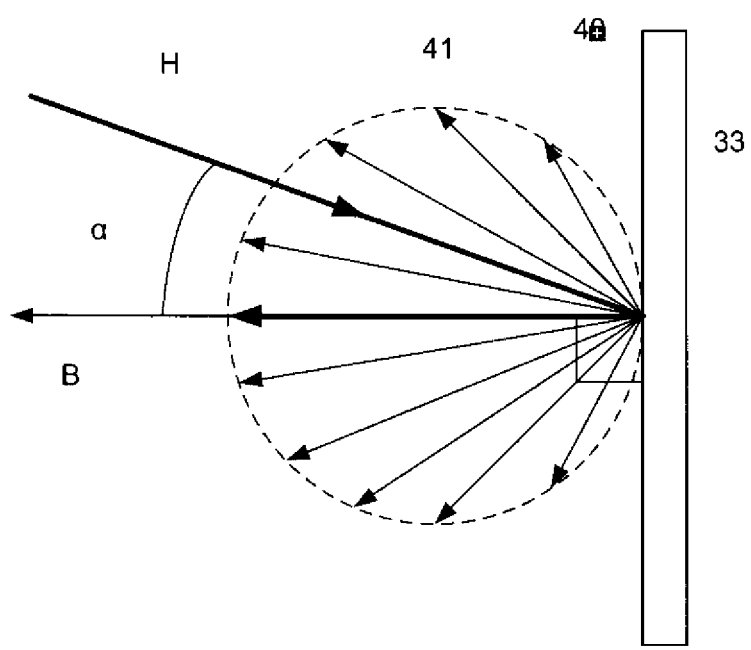
Figure 9:
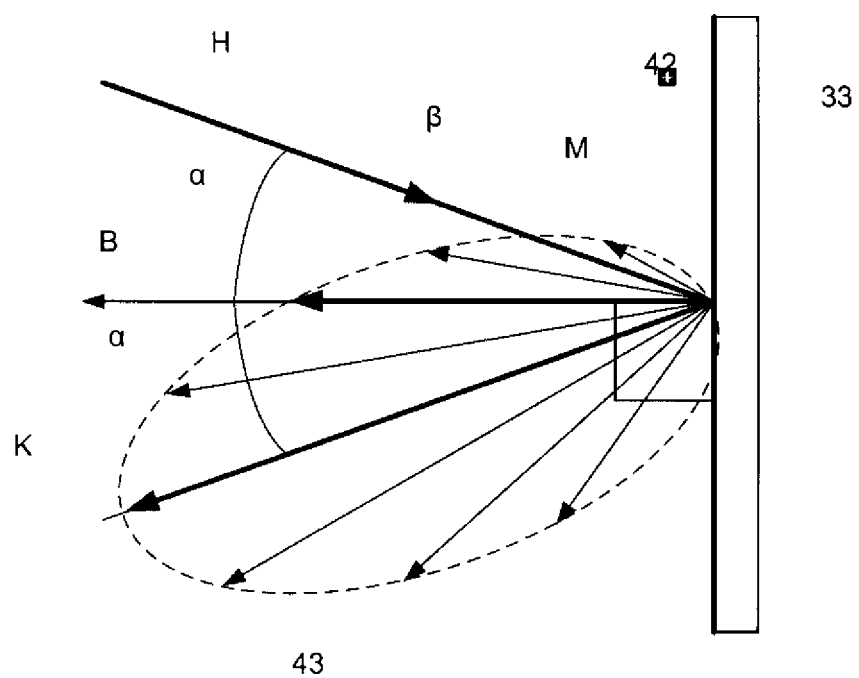

The invention will now be explained in more details with reference to the drawings, in which:

FIG. 1 is a perspective view of a part of a component placement device,

FIG. 2 is a side view of a component placement device according to the invention, as used in the component placement device of FIG. 1, FIG. 3. is a developed plan view of the optical light path of the component placement unit shown in FIG. 2, FIG. 4 is a developed plan view of a part of the optical light path shown in FIG. 3 with a number of light beams, FIG. 5 is a developed plan view of a part of the optical light path shown in FIG. 3 with other light beams, FIG. 6 is a schematic view of a complete mirror surface with a light beam falling thereon, FIG. 7 is a schematic view of a complete reflecting surface with a light beam falling thereon, FIG. 8 is a schematic view of a surface with a Lambertian diffuser with a light beam falling thereon, and FIG. 9 is a schematic view of a surface with a diffuser with a relatively small diffusion angle with a light beam falling thereon.

Like parts are indicated by the same numerals in the figures.

FIG. 1 shows a perspective view of a part of a component placement device 1 which comprises a substrate feed-in/feed-out device 2 and three component placement units 3 according to the invention. Each component placement unit 3 comprises an elongated U-shaped frame 4, a first slide 5, which is movable in the direction indicated by the double arrow Y with respect to the frame 4, and a second slide 6, which is movable in the direction indicated by the double arrow X with respect to the first slide 5. The second slide 6 is provided with a nozzle 7, which is movable in the direction indicated by the double arrow Z with respect to the second slide 6. As FIG. 2 clearly shows, the nozzle 7 is rotatable in the direction indicated by the arrow φ about the central axis 8, which extends parallel to the Z-direction. The second slide 6 is furthermore provided with an imaging device 9, an optical axis 10 of which extends parallel to the central axis 8. The imaging device 9 comprises a sensor 11, lenses 12, 13 disposed in front thereof, a deflection mirror 14 disposed partially in front of the lens 13, and a light source 15. The deflection mirror 14 includes an angle of 45° with respect to the optical axis 10. The lenses 12, 13 form respectively the first and the second lens assembly. The lens assemblies are telecentric. The first focus plane 16 coincides with the central axis 8 of the nozzle 7. The first focus plane 16 further coincides with a substrate 17 supported by the substrate feed-in/feed-out device 2. A second focus plane 18 of the lens 12 coincides with the sensor 11. A third focus plane 19 coincides with a stop plate 20 that is disposed between the lenses 12, 13, and which is provided with a light passage 21.

The component 22 has been picked up by the nozzle 7 from a component supply position 23. To this end the nozzle 7 has been moved in directions indicated by the arrows X and Y in a manner which is known per se.

As is clearly visible in FIG. 3, a coaxial light source 31 is disposed between the stop plate 20 and the lens 13, which comprises a number of LED's (light emitting diodes) 32, which are arranged in a circle that is situated concentrically on the optical axis 10. On one side of the focus plane 16 that is averted from the light source 31, a diffuser 33 is disposed. Stated differently, diffuser 33 is located on a first side of second lens assembly 13 and the light source 31 comprising LED's 32 are located on a second opposite side of second lens assembly 13. The diffuser 33 includes a plate with a layer of light diffusing material disposed thereon. The space between the diffuser 33 and the lens is the object space.

FIG. 3 shows a number of light beams A, B, C, D, E, F, which are reflected by the diffuser 33. The light beams A, B, C hit an angular point 34 of the component 22, while the light beams D, E, F hit another angular point 35 of the component 22. The light beam A hits angular point 34, is being deflected by the lens 13 and subsequently hits an edge 36 of the light passage 21 in the stop plate 20. Then the light beam A is deflected by the lens 12 to position 37 on the sensor 11.

The light beam B extends between the diffuser 33 and the lens 13, parallel to the optical axis 10, and is consequently deflected by the lens 13 in the direction of the stop plate 20 in the focus plane 19, while beam 5 goes through the centre of the light passage 21. Light beam B is again deflected by the lens 12, while light beam B is extending parallel to the optical axis 10 and hits the sensor 11, just like light beam A on position 37.

The light beam C is deflected by lens 13 in the direction of the stop plate 20, and hits an edge 38, averted from edge 36, of the light passage 21. The light beam C is then deflected via lens 12 to position 37 on the sensor 11. In the same way as the light beams C, B, A, the light beams D, E, F are imaged via the angular point 35 on position 39 of the sensor 11.

FIG. 4 shows an enlarged view of the part of FIG. 3 between the stop plate 20 and the detector 33. On the diffuser 33 the distance between lightbeam A and light beam C is equal to H1, whereas the distance between light beams D an F is H2.

A light beam that is reflected by the diffuser 33 from a side of light beam A that is averted from light beam B, and that hits angular point 34, will be deflected by lens 13 to an area on the stop plate 20 beneath the edge 36. In the same manner a light beam that is situated on a side of light beam C, that is averted from light beam B, and that hits angular point 34, will be deflected by lens 13 to an area of the stop late 20 that is above the edge 38.

This means that only light that originates from the areas with the distance H1, H2 reaches the sensor 11 via the angular points 34, 35.

FIG. 4 further shows a light beam G, remote from the component 22, that extends parallel to the optical axis 10, and that is deflected by the lens 13 towards the centre of the light passage 21 in the stop plate 20.

Light that is emitted by the light source 31 in the direction of the reflecting layer of the stop plate 20 will be deflected by the reflecting layer in the direction of the diffuser 33.

FIG. 5 shows a light beam H, originating from the stop plate 20, which light beam H is deflected by the lens 13 in the direction of a diffuser 33', that acts as a pure mirror. Because the diffuser 33' acts as a true mirror, the light beam H will have an exit angle α with respect to the optical axis 10, which is similar to the incidence angle α (see FIG. 6). As is clearly visible in FIG. 5, such reflected light beam H will be deflected in the direction of the component 22, and will be stopped by the component 22. That is why such deflection of the light beam H is undesirable.

If the light beam H is reflected 100% by a diffuser 33", while the diffuser 33" functions as retro-reflector, the light beam H will not hit the component 22 at all, which is also undesirable (see FIG. 7).

FIG. 8 shows a first embodiment of a diffuser 33 according to the invention, where a light beam H is diffused evenly in all directions by means of the surface 40 of the diffuser 33, the light beams being arranged in a sphere 41. As a result the light beam B will be deflected in the direction of the angular point 34, which light beam B will subsequently hit the sensor 11 on position 37. Although in this way an illumination of the component 22 will be obtained, the light output will be relatively limited because of the even diffusion of the light beam H in all directions.

FIG. 9 shows a diffuser 33 according to the second embodiment, where the surface 42 comprises a light-diffusing layer that diffuses the light beam H with a preference to the direction indicated by light beam K. The light beams brought about by the light beam H through the diffuser 33 are arranged in an ellipse 43. The diffuser 33 has a so-called half-value width angle 2β that is determined by the angle β between the light beam K and the light beam M, the intensity of which is half of the intensity of the light beam K. This half-value width angle 2β or FWHM-angle is preferably nearly similar to twice the incidence angle α, which means 2α of the light beam H. With such values the light output for illuminating the component 22 is optimal.

The light passage 21 in the stop plate 22 has a diameter that is determined by a combination of a desired depth of focus and the resolution of the image.

The diameter of the lens 13 is preferably at least equal to the diameter of the largest component 22 that is preferred to be measured, and is further determined by the diameter on the area on the stop plate 20, by which suitable light for illumination of the component is directed to the diffuser 33.

The component placement unit 3 is operated in the following way. While moving the component 22 from the component supply position 23 to a desired position 24 on the substrate 17, the nozzle 7 with the attached component 22 is rotated about the central axis 8 in the directions indicated by the arrow φ. During said rotation, images of the contours of the component 22 in the focus plane 16 are produced by means of the sensor 11 at a number of positions that are known in advance. From said images of the contours the position and orientation of the component 19 relative to the nozzle 7 can be determined by means of an arithmetic unit. Moreover, one or more images of the position 21 on the substrate 17 are produced by the sensor 11. From said images, which have been produced at a position of the slide 6 with respect to the frame 4 that is stored in an arithmetic unit, the location of the position 21 with respect to the nozzle 7 and thus of the component 19 with respect to the position 21 can be determined. Subsequently, the component 19 can be placed precisely at the desired location 21.

Since the contours of the component 22 are sensed by means of the sensor 11, the position and orientation of the component 22 with respect to the nozzle 7 can be determined in a relatively simple manner. Since the optical element is telecentric, a relatively sharp image of the component 22 is obtained.

The device shown in FIG. 3 is also applicable in producing images of other objects that are sensed in transmission.

The reflecting side of the stop plate 20 should reflect or diffuse light falling thereon in such a way, that the light can be used as much as possible for illuminating the component 22 via the lens 13 and the diffuser 33.

It is also possible to dispose the light source 32 between the lens 13 and the focus plane 16, while the light source is directed straight to the diffuser 33. In such arrangement the diffusion angle of the diffuser 33 should be larger than in case of the light source being directed towards the stop plate 20.

The invention claimed is:

1. A component placement unit for placing a component on a substrate, said component placement unit comprising
   at least a nozzle which is rotatable about a central axis, by means of which a component can be picked up and placed on the substrate, said component placement unit further comprises
   at least a device for producing an image of the component disposed in an object space, which device comprises at least a sensor,
   a first lens assembly disposed in front of the sensor,
   a stop plate comprising a light passage, disposed in front of the first lens assembly,
   a second lens assembly disposed in front of the stop plate and the object space disposed in front of the second lens assembly,
   a light source,
   a diffuser which is disposed on a side of the object space that is averted from the light source, and
   wherein the light source is located on the same side of the central axis as at least the second lens assembly, whilst the diffuser is located on a different side of the central axis than the light source.

2. The component placement unit according to claim 1, wherein the sensor is adapted to provide an image of at least a part of the substrate as well as of the component.

3. The component placement unit according to claim 1, wherein the light source is disposed between the stop plate and the second lens assembly, as well as is directed towards a reflecting side of the stop plate.

4. The component placement unit according to claim 3, wherein the sensor is adapted to provide an image of at least a part of the substrate as well as of the component.

5. The component placement unit according to claim 1, wherein the optical axis of the lens assemblies extends parallel to the central axis of the nozzle, while a deflection element being disposed between the lens assemblies and the central axis, by means of which at least a contour of the component in the object space can be imaged on the sensor.

6. The component placement unit according to claim 5, wherein the sensor is adapted to provide an image of at least a part of the substrate as well as of the component.

7. The component placement unit according to claim 1, wherein the different side of the central axis is an opposite side of the central axis than the location of the light source.

8. The component placement unit according to claim 1, wherein the light source is disposed between the stop plate and the second lens assembly.

9. The component placement unit according to claim 1, wherein a focus plane coincides with the central axis.

* * * * *